(12) United States Patent
Kelly et al.

(10) Patent No.: US 6,900,992 B2
(45) Date of Patent: May 31, 2005

(54) PRINTED CIRCUIT BOARD ROUTING AND POWER DELIVERY FOR HIGH FREQUENCY INTEGRATED CIRCUITS

(75) Inventors: Christopher J. Kelly, Portland, OR (US); Jeffrey L. Krieger, Portland, OR (US); Raymond P. Askew, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 212 days.

(21) Appl. No.: 09/955,230

(22) Filed: Sep. 18, 2001

(65) Prior Publication Data

US 2003/0053302 A1 Mar. 20, 2003

(51) Int. Cl.$^7$ ............................ H05K 7/02; H05K 7/06; H05K 7/08; H05K 7/10
(52) U.S. Cl. ........................................ 361/794; 361/780
(58) Field of Search .................... 361/772–784, 361/792–795, 766, 760–764, 816, 818; 257/690–692, 772–779; 333/12, 121, 33, 333, 246, 247; 174/256–262

(56) References Cited

U.S. PATENT DOCUMENTS

| | | | | |
|---|---|---|---|---|
| 5,396,397 A | * | 3/1995 | McClanahan et al. ....... | 361/313 |
| 5,428,506 A | * | 6/1995 | Brown et al. ................ | 361/794 |
| 5,471,090 A | * | 11/1995 | Deutsch et al. ............. | 257/734 |
| 5,586,007 A | * | 12/1996 | Funada ....................... | 361/720 |
| 5,590,030 A | * | 12/1996 | Kametani et al. ........... | 361/794 |
| 5,672,911 A | * | 9/1997 | Patil et al. .................. | 257/691 |
| 5,708,569 A | * | 1/1998 | Howard et al. ............. | 361/760 |
| 5,741,729 A | * | 4/1998 | Selna .......................... | 438/125 |
| 5,912,809 A | * | 6/1999 | Steigerwald et al. ........ | 361/780 |
| 5,955,704 A | * | 9/1999 | Jones et al. ................. | 174/262 |
| 5,966,294 A | * | 10/1999 | Harada et al. .............. | 361/794 |
| 6,064,113 A | * | 5/2000 | Kirkman ..................... | 257/691 |
| 6,084,779 A | * | 7/2000 | Fang .......................... | 361/763 |
| 6,150,895 A | * | 11/2000 | Steigerwald et al. ......... | 333/12 |
| 6,166,457 A | * | 12/2000 | Iguchi et al. ................ | 307/91 |
| 6,181,278 B1 | * | 1/2001 | Kakimoto et al. ... | 343/700 MS |
| 6,191,472 B1 | * | 2/2001 | Mazumder ................... | 257/691 |
| 6,236,572 B1 | * | 5/2001 | Teshome et al. ............ | 361/794 |
| 6,246,112 B1 | * | 6/2001 | Ball et al. ................... | 257/690 |
| 6,307,769 B1 | * | 10/2001 | Nuxoll et al. ................ | 365/63 |
| 6,331,451 B1 | * | 12/2001 | Fusaro et al. ............... | 438/126 |
| 6,477,057 B1 | * | 11/2002 | Buffet et al. ................ | 361/780 |

* cited by examiner

*Primary Examiner*—Kamand Cuneo
*Assistant Examiner*—Tuan Dinh
(74) *Attorney, Agent, or Firm*—Trop, Pruner & Hu, P.C.

(57) ABSTRACT

A printed circuit board includes a signal layer and a supply voltage plane layer. The signal layer includes traces to communicate signals that are not associated with regulated supply voltages. The supply voltage plane is embedded in the signal layer to supply power to multiple supply voltage pins of a component that is mounted to the printed circuit board. The printed circuit board may also include a supply voltage plane layer to communicate a supply voltage. A ground plane may be embedded in the supply voltage plane layer to provide ground connections to multiple pins of the component.

15 Claims, 5 Drawing Sheets

PRINTED CIRCUIT BOARD ROUTING AND POWER DELIVERY FOR HIGH FREQUENCY INTEGRATED CIRCUITS

BACKGROUND

The invention generally relates to printed circuit board routing and power delivery for high frequency integrated circuits.

Referring to FIG. 1, a typical printed circuit board (PCB) 5 includes various conductive layers and a substrate, or core 12, that supports circuit components (mounted to the PCB 5) and the conductive layers of the PCB 5. As an example, in a four layer PCB configuration, two of the four layers may be located one side (called a "top side" for purposes of simplifying the discussion) of the core 12, and two layers may be located on the opposite, bottom side of the core 12.

As a more specific example, the PCB 5 depicted in FIG. 1 has four conductive layers, or is a "four layer PCB," that includes such layers as a top signal layer 8, a layer that includes etched out conductive traces to route various communication signals that are associated with components that are mounted to the PCB 5 above the layer 8. The PCB 5 also includes a supply voltage plane layer 10 that is located between the signal layer 8 and the top side of the core 12. As its name implies, the supply voltage plane layer 10 provides a supply voltage to the various components that are mounted to the PCB 5, and like all layers beneath it, the layer 10 may be accessed by vertically extending vias (not shown). On the bottom side of the core 12, the PCB 5 includes a ground plane layer 14 that is located next to the core 12 and serves as a ground connection for the components that are mounted to the PCB 5. Adjacent to the ground plane layer 14 and forming the bottom layer of the PCB 5 is another signal layer 16 that, similar to the top signal layer 8, communicate various communication signals that are associated with components that are mounted to the PCB 5. All the above-described conductive layers of the PCB 5 are electrically isolated from each other via insulating layers 20.

Thus, in the PCB 5, the supply voltage plane 10 and ground plane 14 layers are separated by the relatively thick core 12 (as compared to the thickness of any of the conductive layers of the PCB 5), an arrangement that may introduce significant parasitic inductance. In this manner, when an electrical signal propagates along a trace on either the top 8 or bottom 16 signal layers, a return current is established to "close the loop" and make the net current flow equal to zero. This return current path selects the path of least resistance to flow in, and thus, the return current path tends to be routed through the ground plane layer 14. For an electrical signal propagating along a trace on the bottom signal layer 16, this is desirable because the return current path that is established is approximately the thickness of one of the insulating layers 20 (i.e., the thickness between the ground 14 and the bottom signal layer 16) to establish a relatively small parasitic inductance.

However, in contrast, for an electrical signal that propagates along the top signal layer 8, the return current loop is significantly larger due to the thickness of the intervening core 12. As an example, the effective inductance experienced along the path of the return current for a signal propagating along the top signal layer 8 may be about ten times the effective inductance than the inductance experienced by a signal propagating along the bottom signal layer 16. Such large inductances for signals of the top signal layer 8 may present challenges for a PCB design to be used with high frequency components, i.e., the components that are most susceptible to these large inductances.

Thus, there is continuing need for an arrangement to address one or more of the problems that are stated above.

DETAILED DESCRIPTION

Figure 2:
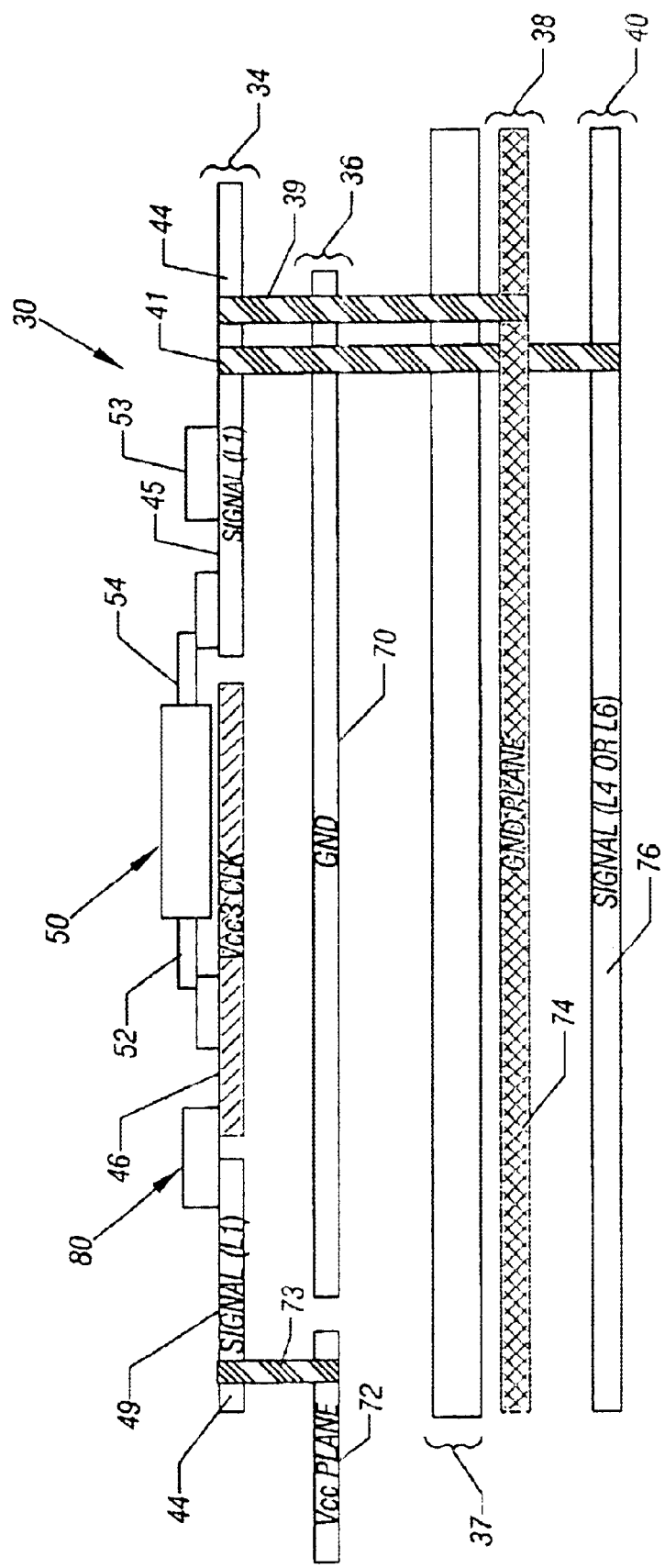
FIG. 2 is an exploded schematic side view of a printed circuit board according to an embodiment of the invention.

Referring to FIG. 2, an embodiment 30 of a printed circuit board (PCB) 30 in accordance with the invention is constructed to minimize the degree of noise that the PCB 30 induces on high frequency signals that propagate across the PCB 30. In particular, the PCB 30 includes a top signal layer 34 that includes embedded supply voltage planes 46 (one embedded supply voltage plane 46 being depicted in FIG. 2) and an adjacent supply voltage plane layer 36 that is located below the layer 34 and includes embedded ground planes 70 (one embedded ground plane 70 being depicted in FIG. 2). As described below, each high frequency component that is mounted on the top side of the PCB 30 is located near and is coupled to one embedded supply voltage plane 46 and one embedded ground plane 70 for purposes of minimizing inductances that may otherwise be introduced by the PCB 30. Although a four layer PCB is described, the arrangements described herein are not limited to four layer PCBs and thus, may be applied to other multiple layer PCBs, such as six and eight layer PCBs, for example.

Thus, due to this arrangement, the current return paths for signals propagating in the top signal layer 34 do not pass through the relatively thick (as compared to the conductive layers) substrate, or core 37 of the PCB 30. Therefore, parasitic inductances otherwise induced by the PCB 30 are minimized. Furthermore, as described below, due to this arrangement, a low-noise, high quality and highly-decoupled path between a supply voltage and a particular die pad may be created.

More particularly, in general, the top signal layer 34 includes a signal region 44 that includes traces to communicate various non-supply voltage related signals. The supply voltage planes 46 are surrounded by this region 44, and each supply voltage plane 46 is associated with and located near supply voltage pins 52 of a particular associated high frequency component (such as the component 50) for purposes of providing a supply voltage to the component 50. As described below, in some embodiments of the invention, each supply voltage plane 46 has an outer boundary that is generally established by the supply voltage pins 52 of the associated component 50 so that the pins 52 vertically extend into the associated plane 56 near the plane's outer periphery.

For each high frequency component that is mounted to the top side of the PCB 30, the supply voltage plane layer 36 includes an associated embedded ground plane 70. In this manner, the supply voltage plane layer 36 generally includes a region 72 to communicate a supply voltage to components of the PCB 30. The ground plane(s) 70 of the PCB 30 are surrounded by this region 72. In some embodiments of the invention, each ground plane 70 has a boundary that is generally defined by the locations of ground vias 39 that extend from the signal trace region 44 of the top layer 34 to the ground plane 70 for purposes of establishing a return current path for an electrical device (resistor or capacitor, for example) that is connected to the high frequency component 50. For example, an electrical device 53 may be connected between an electrical trace 45 that extends to a pin 54 of the component 50 and the via 39. The ground plane 70 is generally larger in size than the associated supply voltage plane 46, is located directly beneath and separated by only one of the insulating layers 20 from the associated supply voltage plane 46. In some embodiments of the invention, the ground plane 70 circumscribes the projection of the supply voltage plane 46 onto the supply voltage plane layer 36.

In some embodiments of the invention, each supply voltage plane 46 is coupled to the region 72 of the supply voltage plane layer 36 by way of an inductive element 80 (a ferrite bead inductor, for example) that has one terminal that is coupled to the embedded supply voltage plane 46. The other terminal of the inductive element 80 is coupled to a signal trace 49 (in the signal communication region 44 of the signal layer 34) that couples the inductive element 80 to a via 73. The via 73 vertically extends to connect the region 46 (of the supply voltage layer 36) to the inductive element 80 and thus, couple the region 72 to the supply voltage plane 46.

Each ground plane 70 is coupled to a ground plane layer 38 (of the PCB 30) by way of a via 45 that vertically extends between the ground plane 70 and the ground plane layer 38. The ground plane layer 38 is located next to the substrate 37 on the opposite side of the substrate 37 from the layers 34 and 36.

Among other possible layers of the PCB 30, the PCB 30 may include at least one additional signal layer, such as a signal layer 40 that may form the bottom layer of the PCB 30, for example.

Figure 1:
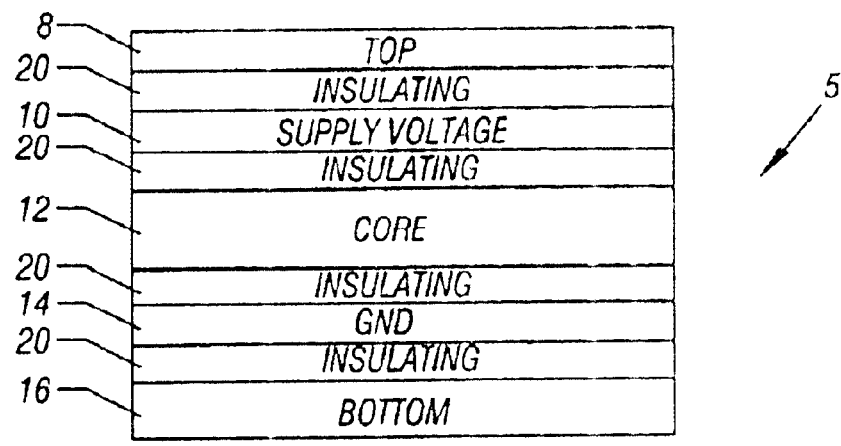
FIG. 1 is a schematic diagram of a side view of a printed circuit board of the prior art.
Figure 3:
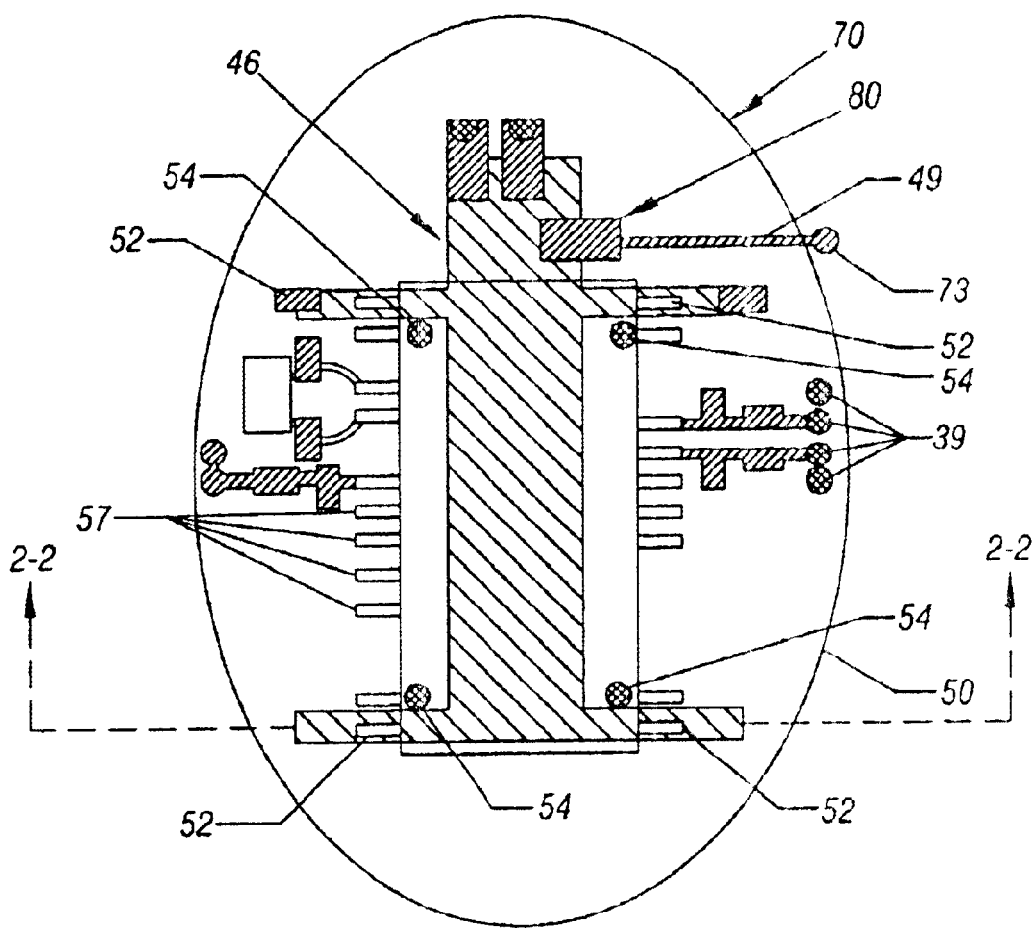
FIG. 3 is a schematic top view of the printed circuit board of FIG. 2 according to an embodiment of the invention.

As a more specific example of the relationship of a particular high frequency component 50 to the associated embedded supply voltage plane 46 and embedded ground plane 70, FIG. 3 depicts a schematic top view of the PCB 30 near the high frequency component 50. In other embodiments of the invention, the component 50 may have a different shape (a square shape, as an example) and may have supply voltage pins that are not necessarily located near its four corners. Furthermore, the component 50, in some embodiments of the invention, may have a package, such as ball grid package (for example), that does not use the die pads that are depicted in FIG. 3.

As shown in FIG. 3, for this example, the component 50 includes supply voltage pins 52 that are located near the four corners of the generally rectangular (from the top view) component 50. The supply voltage pins 52 extend vertically into the embedded supply voltage plane 46, and as shown, the associated embedded supply voltage plane 46 extends beneath the main body of the component 50 and extends inside the signal pins 57 of the component 50. The outer periphery of the supply voltage plane 46 extends closely around the ground pins 54 of the component 50 and extends from underneath the main body of the component 50 to allow the supply voltage pins 52 to extend downwardly to contact the supply voltage plane 46.

The ground plane 70 extends a sufficient distance about the component 50 so that the ground vias 39 may extend downwardly to make electrical connections with the ground plane 70. As depicted in FIG. 3, a signal trace 81 extends from an inductive element 80 to the via 73 extends beyond the embedded ground plane 70 and into the region 72 of the supply voltage plane layer 36.

Figure 4:
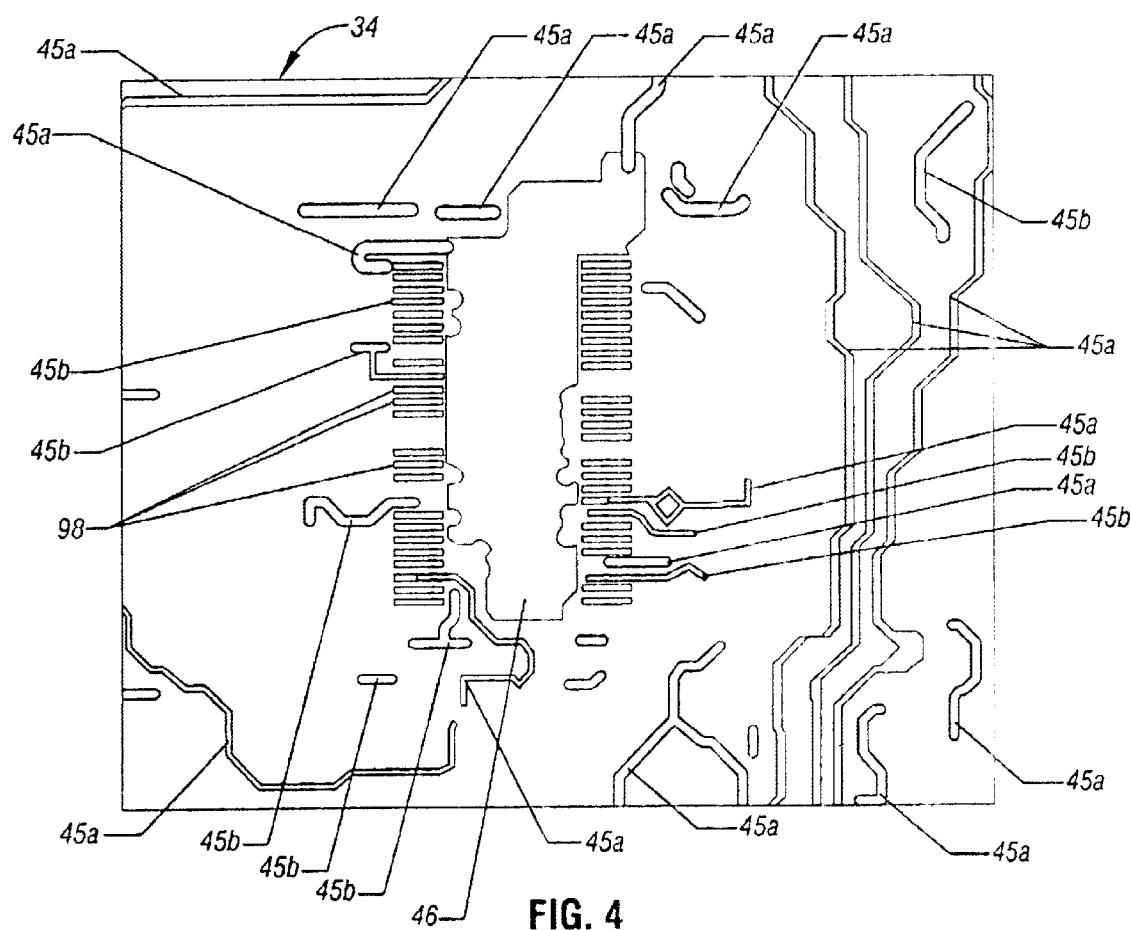
FIGS. 4 and 5 are schematic diagrams depicting different layers of the printed circuit board according to an embodiment of the invention.

FIG. 4 depicts a more specific example of the signal layer 34 in accordance with an embodiment of the invention. The signal layer region 44 (i.e., the region in FIG. 4 other than the supply voltage plane 46) includes pads 98 for mechanically and electrically connecting the pins of the component 50 to the PCB 30 using solder connections between the pins and the pads 98. The pads 98 in this example are generally arranged in two parallel rows, and the embedded supply voltage region 46 extends between these two parallel rows of pads 98. Other arrangements/organizations are possible for the pads 98, in other embodiments of the invention.

As depicted in FIG. 4, the signal layer region 44 also includes signal traces 45a that are used to communicate signals between the component 50 and other components mounted to the PCB 30. The signal layer region 44 also includes signal traces 45b that are connected to the vias 39 (not shown in FIG. 4) that extend to the embedded ground region 70 of the layer 36 as well as possibly extend to the ground layer 38.

Figure 5:
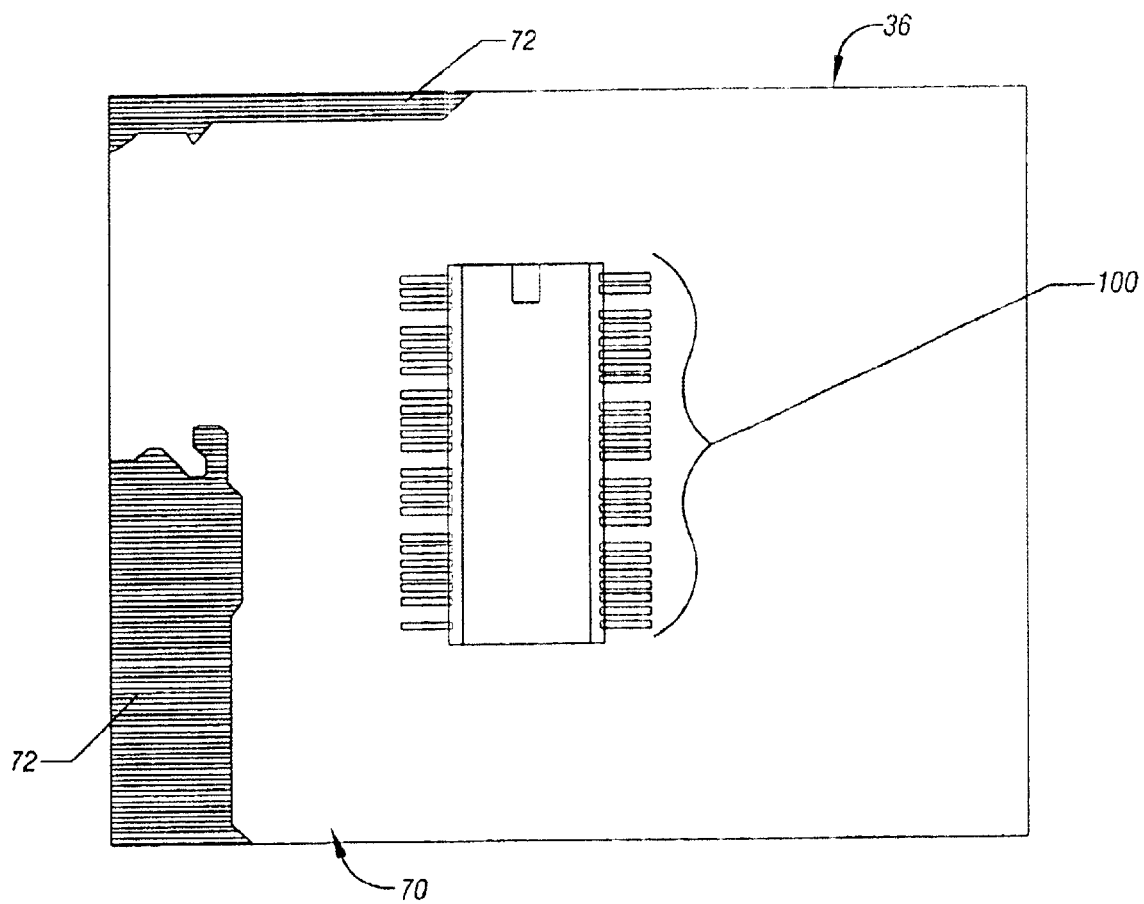

FIG. 5 depicts a more specific example of the supply voltage plane layer 36 in accordance with an embodiment of the invention. Also depicted in FIG. 5 is a projection 100 of the component 50 on the layer 36. As shown, the ground plane 70 surrounds a region around the projection 100 to allow vias to extend from all high frequency signal traces associated with the component 50 to the embedded ground plane 70. Part of the region 72 (of the layer 36), which surrounds the embedded ground plane 70, is also depicted in FIG. 5.

Figure 6:
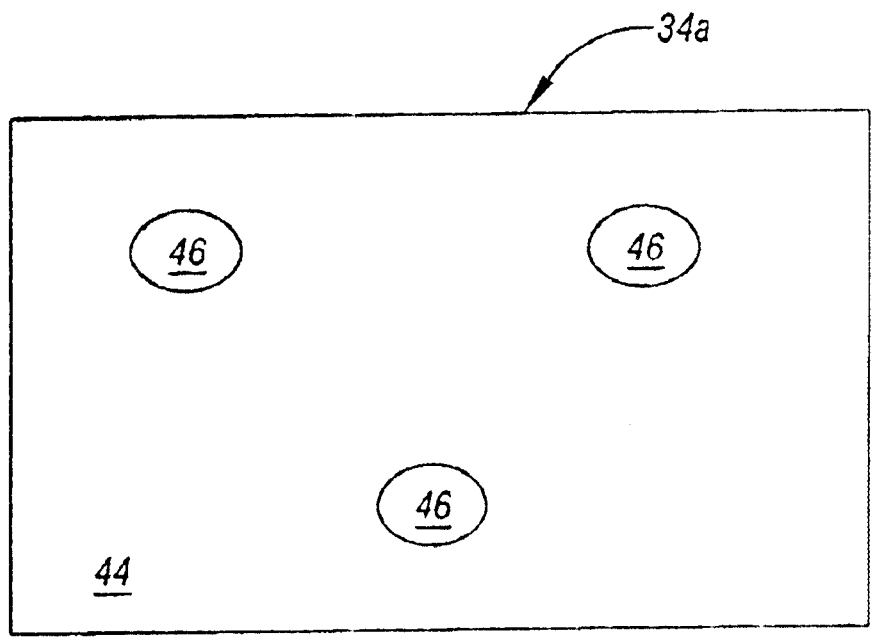
FIGS. 6 and 7 are top views of layers of the printed circuit board according to an embodiment of the invention.
Figure 7:
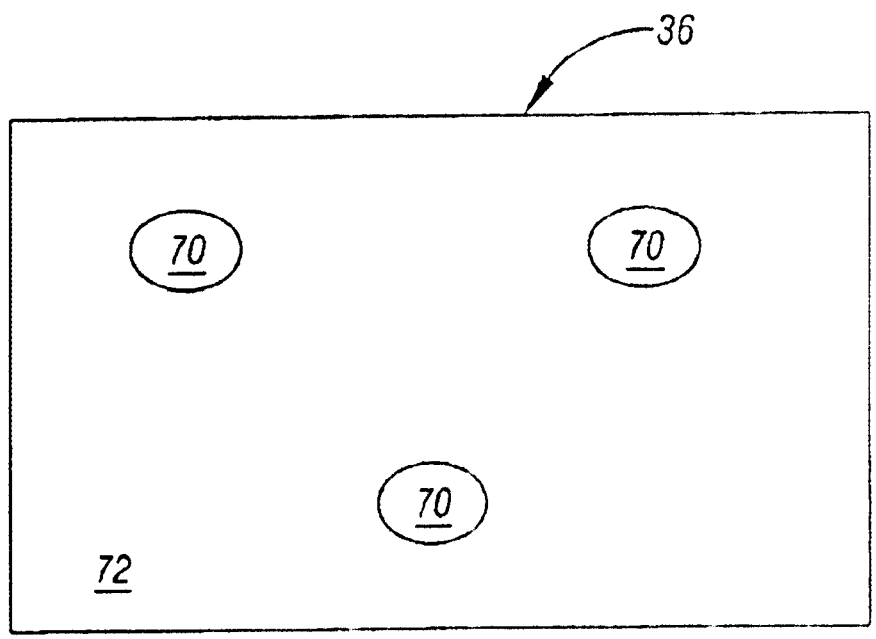

Referring to FIGS. 6 and 7, the layers of the PCB 30 have been discussed in association with a particular high frequency component 50. However, the PCB 30 may have more than one high frequency component, and thus, the PCB 30 may have multiple embedded supply voltage planes 46 within a top signal layer 34a. Corresponding to the signal layer 34a, the supply voltage plane layer 36 includes embedded ground planes 70, each of which is associated with and larger than a corresponding one of the embedded supply voltage planes 46.

Although the various embodiments have been described herein using orientational terms, such as "top," "bottom," etc., such orientations are used for purposes of simplifying discussion of these embodiments and are not necessary to practice the invention.

While the invention has been disclosed with respect to a limited number of embodiments, those skilled in the art, having the benefit of this disclosure, will appreciate numerous modifications and variations therefrom. It is intended that the appended claims cover all such modifications and variations as fall within the true spirit and scope of the invention.

What is claimed is:

1. A printed circuit board comprising;
   a printed circuit board substrate;
   a signal layer supported by the printed circuit board substrate, the signal layer comprising traces to communicate signals not associated with regulated supply voltages;
   a supply voltage plane supported by the printed circuit board substrate, the supply voltage plane embedded in the signal layer to supply power to multiple supply voltage pins of a component mounted to the printed circuit board; and a supply voltage plane layer different from the signal layer, the supply voltage plane layer comprising an embedded ground plane to provide ground connections for the signal layer.

2. The printed circuit board of claim 1, wherein the ground connections are associated with electrical devices connected to the component.

3. The printed circuit board of claim 1, wherein the ground plane has an outer boundary established by the ground connections.

4. The printed circuit board of claim 1, wherein the ground plane lies substantially within a region located directly below the component, the component being mounted on top of the signal layer.

5. The printed circuit board of claim 1, wherein the ground plane is significantly larger than the supply voltage plane.

6. The printed circuit board of claim 1, wherein the ground plane has an outer boundary that circumscribes a projection of the supply voltage plane onto the supply voltage plane layer.

7. The printed circuit board of claim 1, further comprising:

a core layer, wherein the signal layer and the supply voltage plane layer are on the same side of the core layer.

8. The printed circuit board of claim 1, wherein the ground plane reduces an inductance.

9. A printed circuit board comprising:

a printed circuit board substrate;

a supply voltage plane layer supported by the printed circuit board substrate, the supply voltage plane layer to communicate a supply voltage; and a ground plane supported by the printed circuit board substrate, the ground plane embedded in the supply voltage plane layer to provide ground connections to multiple pins of a component mounted to the printed circuit board, wherein the ground connections are associated with electrical devices connected to the component.

10. The printed circuit of claim 9, further comprising:

a ground plane layer separate from the supply voltage plane layer.

11. The printed circuit board of claim 11, wherein the ground plane lies substantially within a region located directly below the component, the component being mounted on top of a signal layer.

12. The printed circuit board of claim 9, wherein the ground plane has an outer boundary established by the ground connections.

13. A method comprising:

for each high frequency component to be mounted on a printed circuit board, embedding an associated supply voltage plane in a signal layer of the printed circuit board to provide power to the component, the signal layer being used to communicate high frequency signals associated with the high frequency component or components; and for each supply voltage plane embedded in the signal layer, embedding an associated ground plane in a supply voltage plane layer of the printed circuit board to provide ground connections for the component associated with said supply voltage plane embedded in the signal layer.

14. The method of claim 13, further comprising:

providing a core to support the signal layer and the supply voltage plane layer; and locating the signal layer and the supply voltage plane layer on the same side of the core.

15. The method of claim 13, further comprising:

providing a ground plane layer on the opposite side of the core from said same side of the core; and connecting the ground plane or planes embedded in the supply voltage plane layer to the ground plane layer.

\* \* \* \* \*